(12) United States Patent
Hu et al.

(10) Patent No.: US 9,640,446 B2
(45) Date of Patent: May 2, 2017

(54) SEMICONDUCTOR STRUCTURE AND FABRICATION METHOD THEREOF

(71) Applicant: Semiconductor Manufacturing International (Shanghai) Corporation, Shanghai (CN)

(72) Inventors: Huayong Hu, Shanghai (CN); Lihua Ding, Shanghai (CN); Weiming He, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/947,673

(22) Filed: Nov. 20, 2015

(65) Prior Publication Data

US 2016/0163605 A1 Jun. 9, 2016

(30) Foreign Application Priority Data

Dec. 4, 2014 (CN) .......................... 2014 1 0736249

(51) Int. Cl.
*H01L 21/4763* (2006.01)
*H01L 21/66* (2006.01)
*H01L 21/027* (2006.01)
*H01L 21/311* (2006.01)
*H01L 21/033* (2006.01)
(Continued)

(52) U.S. Cl.
CPC ............ *H01L 22/12* (2013.01); *G03F 9/7034* (2013.01); *H01L 21/0276* (2013.01); *H01L 21/0332* (2013.01); *H01L 21/31144* (2013.01); *H01L 23/544* (2013.01); *H01L 2223/54426* (2013.01); *H01L 2223/54453* (2013.01); *H01L 2924/0002* (2013.01)

(58) Field of Classification Search
CPC . H01L 22/12; H01L 23/544; H01L 21/02164; H01L 21/0276; H01L 23/5226; H01L 21/31144; H01L 21/76802; H01L 21/76877; H01L 21/02271; H01L 2223/54426
See application file for complete search history.

(56) References Cited

U.S. PATENT DOCUMENTS

| | | | | |
|---|---|---|---|---|
| 7,538,026 | B1 * | 5/2009 | Ghandehari | ........ H01L 21/0276 257/E21.495 |
| 2006/0110685 | A1 * | 5/2006 | Li | ........................... G03F 7/091 430/313 |

(Continued)

*Primary Examiner* — A. Sefer
(74) *Attorney, Agent, or Firm* — Anova Law Group, PLLC

(57) ABSTRACT

A method for fabricating a semiconductor structure is provided. The method includes providing a semiconductor substrate; and forming a plurality of semiconductor devices on the semiconductor substrate. The method also includes forming a dielectric layer covering the plurality of the semiconductor devices on the semiconductor substrate; and forming an optical auxiliary layer configured to reflect a portion of a levelness-detecting light and absorb a portion of the levelness detecting light transmitting through the optical auxiliary layer during a levelness-detecting process over the dielectric layer. Further, the method includes forming a photoresist layer over the optical auxiliary layer; and detecting a levelness of the semiconductor substrate and exposing the photoresist layer to form a patterned photoresist layer.

17 Claims, 4 Drawing Sheets

(51) Int. Cl.
*G03F 9/00* (2006.01)
*H01L 23/544* (2006.01)

(56) References Cited

U.S. PATENT DOCUMENTS

| | | | |
|---|---|---|---|
| 2008/0220578 A1* | 9/2008 | Lee | H01L 21/31116 438/264 |
| 2014/0239462 A1* | 8/2014 | Shamma | G03F 7/092 257/637 |
| 2015/0198896 A1* | 7/2015 | Abe | G03F 1/84 438/7 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201410736249.9, filed on Dec. 4, 2014, the entirety of which is incorporated herein by reference.

FIELD OF THE INVENTION

The present invention generally relates to the field of semiconductor manufacturing technology and, more particularly, relates to semiconductor structures and fabrication processes thereof.

BACKGROUND

Photolithography is one of the important steps in the semiconductor manufacturing technology, which is able to transfer patterns in a reticle to a wafer (or substrate). Thus, a photolithography process is considered as a key step in the manufacturing of Very-Large-Scale-Integrations (VLSIs). The series of complex and time-consuming photolithography processes in the semiconductor manufacturing are mainly achieved by a corresponding exposure apparatus. The development of the photolithography technique, or the progress of the exposure apparatus are mainly focused on three major factors, critical dimension, overlay accuracy, and production capacity.

During the manufacturing of semiconductor structures, an exposure process includes three major steps: changing wafer on a wafer stage; aligning the wafer on the wafer stage with a reticle; and exposing to transfer the patterns on the reticle to the wafer. The step of aligning the wafer with the reticle includes detecting the levelness; and detecting the alignment marks. Detecting the levelness refers to detecting the levelness of the wafer; and detecting the alignment marks refers to detecting the alinement marks formed on the wafer. By detecting the levelness and the alignment marks, the position relationship of the wafer stage, the wafer and the reticle can be formed.

The detection of the wafer levelness is often performed before the alignment mark detection and the exposure of photoresist. The methods for detecting the levelness of the wafer are usually non-contact methods. The commonly used non-contact methods include optical methods, capacitive methods, and pressure methods, etc.

In the existing scan-projecting exposure apparatus, optical methods are often used to detect the levelness of a wafer (or substrate). The levelness detection is realized by a levelness detection unit of the exposure apparatus. The levelness detection unit includes a light-emitting unit and a light-receiving unit. The light-emitting unit is used to emit a levelness-detecting light; and the light-receiving unit is used to receive the levelness-detecting light reflected by the substrate.

FIG. 1 illustrates an existing method for detecting the levelness of a wafer. The method includes providing a semiconductor substrate 100; and forming a dielectric layer 101 on the semiconductor substrate 100. The method also includes forming a filling layer 102 on the dielectric layer 101; and forming a photoresist layer 103 on the filling layer 102.

Then, the semiconductor substrate 100 is loaded on the wafer stage of an exposure apparatus to perform the levelness detection before an exposure process. The light-emitting unit 11 of the levelness detection unit (not labeled) emits a levelness-detecting light. The levelness-detecting light irradiates the semiconductor substrate 100; and is reflected by the semiconductor substrate 100. At the same time, the light-receiving unit 12 of the levelness detecting unit receives the levelness-detecting light reflected by the semiconductor substrate 100. During the levelness-detecting process, the levelness-detecting unit scans along the scanning direction 13 parallel to the surface of the semiconductor substrate 100.

However, the accuracy of such a levelness-detecting method is limited by certain factors. The disclosed device structures and methods are directed to solve one or more problems set forth above and other problems.

BRIEF SUMMARY OF THE DISCLOSURE

One aspect of the present disclosure includes providing a method for fabricating a semiconductor structure. The method includes providing a semiconductor substrate; and forming a plurality of semiconductor devices on the semiconductor substrate. The method also includes forming a dielectric layer covering the plurality of the semiconductor devices on the semiconductor substrate; and forming an optical auxiliary layer configured to reflect a portion of a levelness-detecting light and absorb a portion of the levelness-detecting light transmitting through the optical auxiliary layer over the dielectric layer. Further, the method includes forming a photoresist layer over the optical auxiliary layer; and detecting a levelness of the semiconductor substrate and exposing the photoresist layer to form a patterned photoresist layer.

Another aspect of the present disclosure includes providing a semiconductor structure. The semiconductor structure includes a semiconductor substrate; and a plurality of semiconductor devices formed on the semiconductor substrate. The semiconductor structure also include a dielectric layer covering the plurality of semiconductor devices formed on the semiconductor substrate; and an optical auxiliary layer configured to reflect a portion of a levelness-detecting light and absorb a portion of the levelness-detecting light transmitting through the optical auxiliary layer during a levelness-detecting process formed over the dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
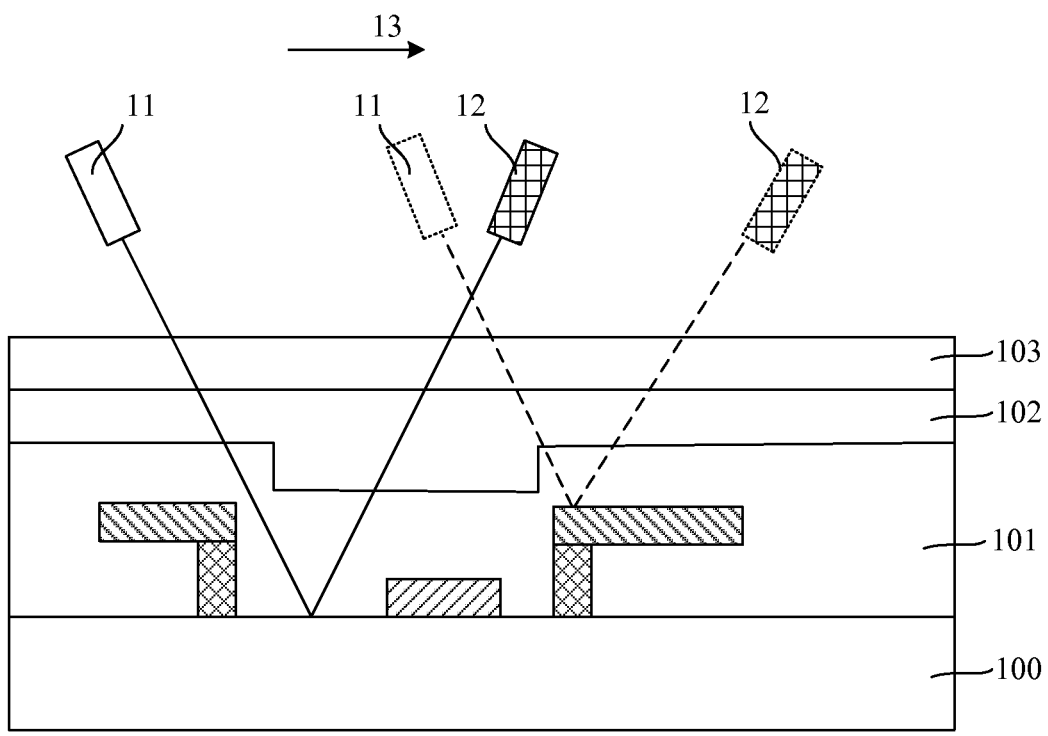
FIG. 1 illustrate an existing levelness-detecting method of a semiconductor substrate.

Referring to FIG. 1, in a semiconductor fabrication process, semiconductor devices, such as transistors, or other semiconductor structures may be formed in the semiconductor substrate 100. Further, interconnect structures, such as metal vias and metal lines, etc., connecting with the semiconductor devices may be formed in the dielectric layer 101. The metal vias and the metal lines may be made of metal materials; and the dielectric layer 101 may be made of silicon oxide. When the a levelness-detecting process is performed, an incident levelness-detecting light may transmit through the photoresist layer 103, the filling layer 102 and the dielectric layer 101 to reach the surface of the semiconductor substrate 100; and may be reflected by the surface of the semiconductor substrate 100. The levelness-detecting unit may scan along the scanning direction 13 when the levelness-detecting process is performed. That is, the light-emitting unit 11 may move along the scanning direction 13.

As shown in FIG. 1, when the light-emitting unit 11 and the light-receiving unit 12 are illustrated with solid lines, the levelness-detecting unit may be at a first position. At the first position, the levelness-detecting light may be reflected by the surface of the semiconductor substrate 100; and received by the light-receiving unit 12. When the light-emitting unit 11 and the light-receiving unit 12 are illustrated with dashed lines, the levelness-detecting unit may move to a second position. At the second position, a portion of the levelness-detecting light emitted by the light-emitting unit 11 may be reflected by the surface of the metal interconnect lines; and may be received by the light-receiving unit 12. Because the height of the surface of the metal interconnect lines and the height of the surface of the semiconductor substrate 100 may be different, a focusing error may be generated; and the levelness-detecting light received by the light-receiving unit 12 may have significantly large noise signals. Therefore, the accuracy of the levelness detection may be reduced.

Figure 2:
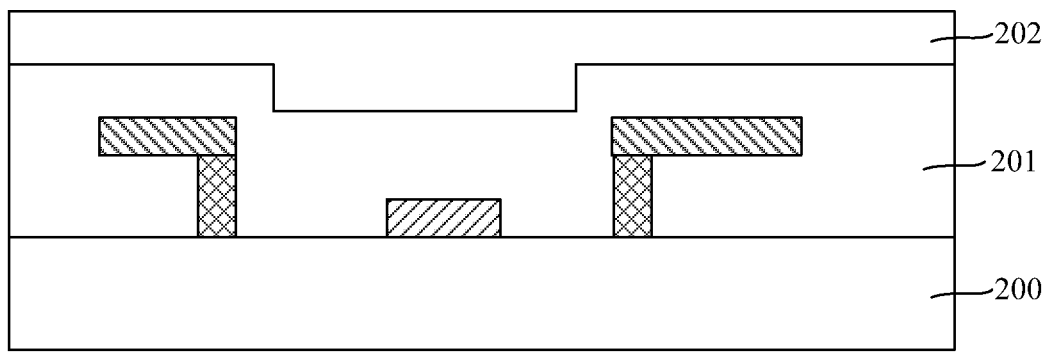
FIGS. 2~4 illustrate semiconductor structures corresponding to certain stages of an exemplary fabrication process of a semiconductor structure consistent with the disclosed embodiments.
Figure 3:
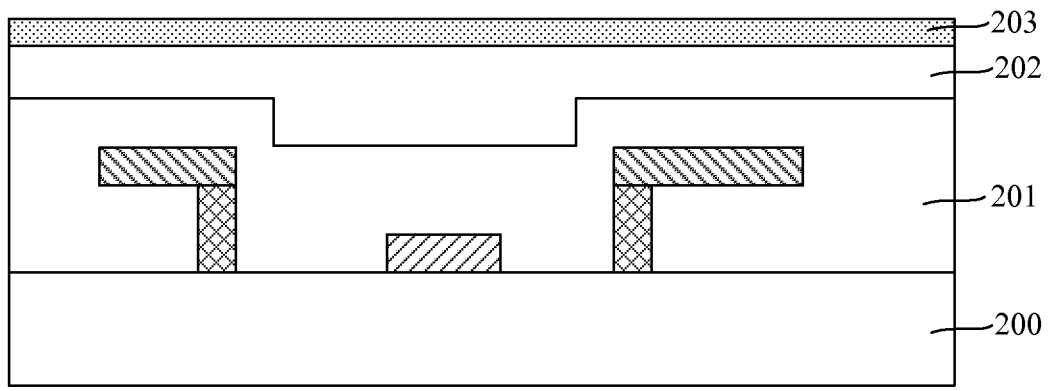
Figure 4:
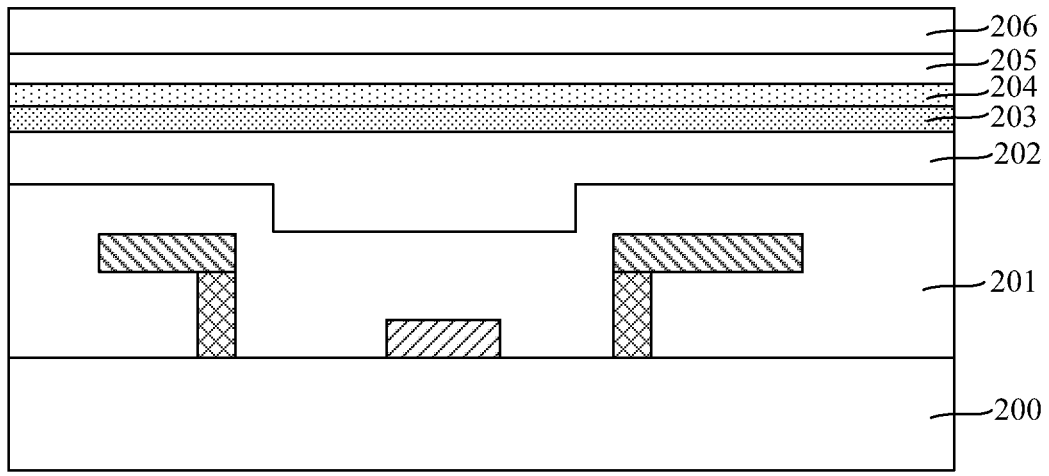
Figure 8:
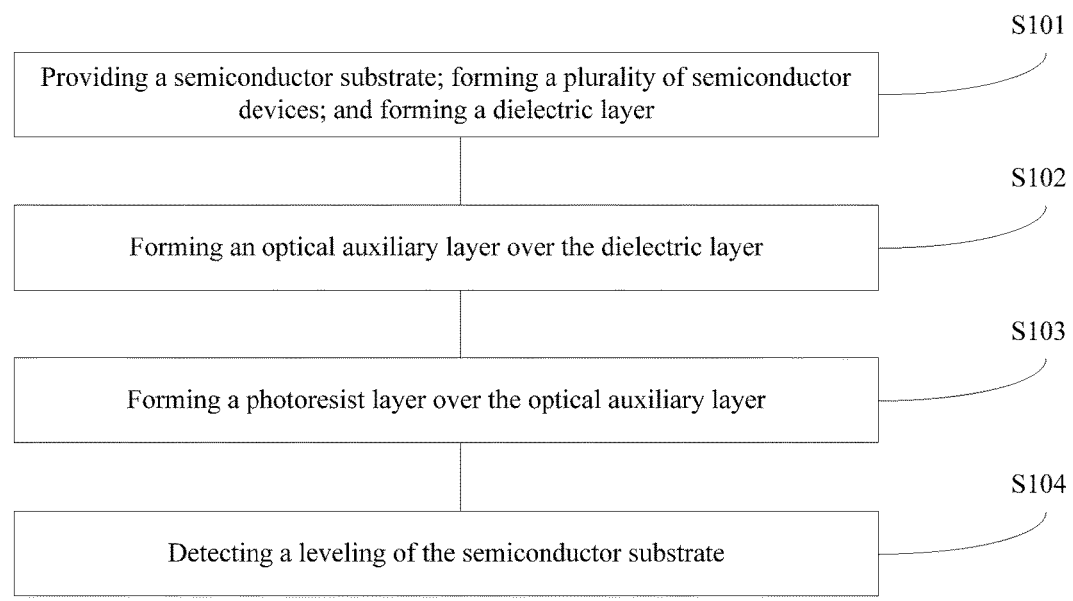
FIG. 8 illustrates an exemplary fabrication process of a semiconductor structure consistent with the disclosed embodiments.

FIG. 8 illustrates an exemplary fabrication process of a semiconductor structure consistent with the disclosed embodiments; and FIGS. 2-4 illustrate semiconductor structures corresponding to certain stages of the exemplary fabrication process.

As shown in FIG. 8, at the beginning of fabrication process, a semiconductor substrate with certain structures is provided (S101). FIG. 2 illustrates a corresponding semiconductor structure.

As shown in FIG. 2, a semiconductor substrate 200 is provided. Semiconductor devices (not labeled) may be formed on the semiconductor substrate 200. Further, a dielectric layer 201 covering the semiconductor devices may be formed on the semiconductor substrate 200. Further, a filling layer 202 may be formed on the dielectric layer 201.

The semiconductor substrate 200 may be made of any appropriate semiconductor materials, such as single crystal silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor or a combination thereof. The semiconductor substrate 200 provides a base for subsequent devices and processes.

The semiconductor devices may include transistors, etc. The transistors may include a gate structure on the surface of the semiconductor substrate 200; and source/drain regions in the semiconductor substrate 200 at both sides of the gate structure. The gate structure may include a gate dielectric layer on the surface of the semiconductor substrate 200; and a gate layer on the gate dielectric layer. Further, metal vias (not labeled) electrically connecting with the source/drain regions or the gate layer of the transistors may be formed in the dielectric layer 201. Further, metal interconnect lines (not labeled) electrically connecting with the metal vias may also be formed in the dielectric layer 201.

The dielectric layer 201 may be a single layer structure, or a multiple-layer stacked structure (e.g., the layer number is greater than one). When the dielectric layer 201 is a multiple-layer structure, metal vias and corresponding metal interconnect layers may be formed in each layer of the multiple-layer structure.

Chemical mechanical planarization processes may be used to form the metal vias and the metal interconnect lines. The chemical mechanical planarization process may cause the surface of the dielectric layer 201 to have defects and/or dents. The defects and/or the dents may also be caused by other processes, such as the process for forming the dielectric layer 201 itself. A flat surface may be desired for a subsequent levelness detection of the semiconductor substrate 200. Thus, the filling layer 202 may be formed on the dielectric layer 201. The filling layer 202 may be able to fill the defects and/or the dents on the surface of the dielectric layer 201; and may have a flat surface after filling the defects and the dents.

The filling layer 202 may be made of any appropriate material, such as organic material, or spin-on material, etc. In one embodiment, the filling layer 202 is made of carbon-containing organic material. Various processes may be used to form the filling layer 202. In one embodiment, the filling layer 202 is formed by a spin-coating process.

Returning to FIG. 8, after forming the filling layer 202, an optical auxiliary layer may be formed (S102). FIG. 3 illustrates a corresponding semiconductor structure.

As shown in FIG. 3, an optical auxiliary layer 203 is formed on the filling layer 202. The optical auxiliary layer 203 may be used to reflect a portion of an incident levelness-detecting light and absorb a portion of the levelness-detecting light transmitting through the optical auxiliary layer 203 during a levelness-detecting process. Thus, the optical auxiliary layer 203 may also be referred as a levelness scanner assist layer (LS-assist layer).

In one embodiment, a photoresist layer may be subsequently formed on the optical auxiliary layer 203. To achieve a high accuracy exposure to the photoresist layer, before exposing the photoresist layer to form patterns, it may need to detect the levelness of the semiconductor substrate 200.

Figure 9:
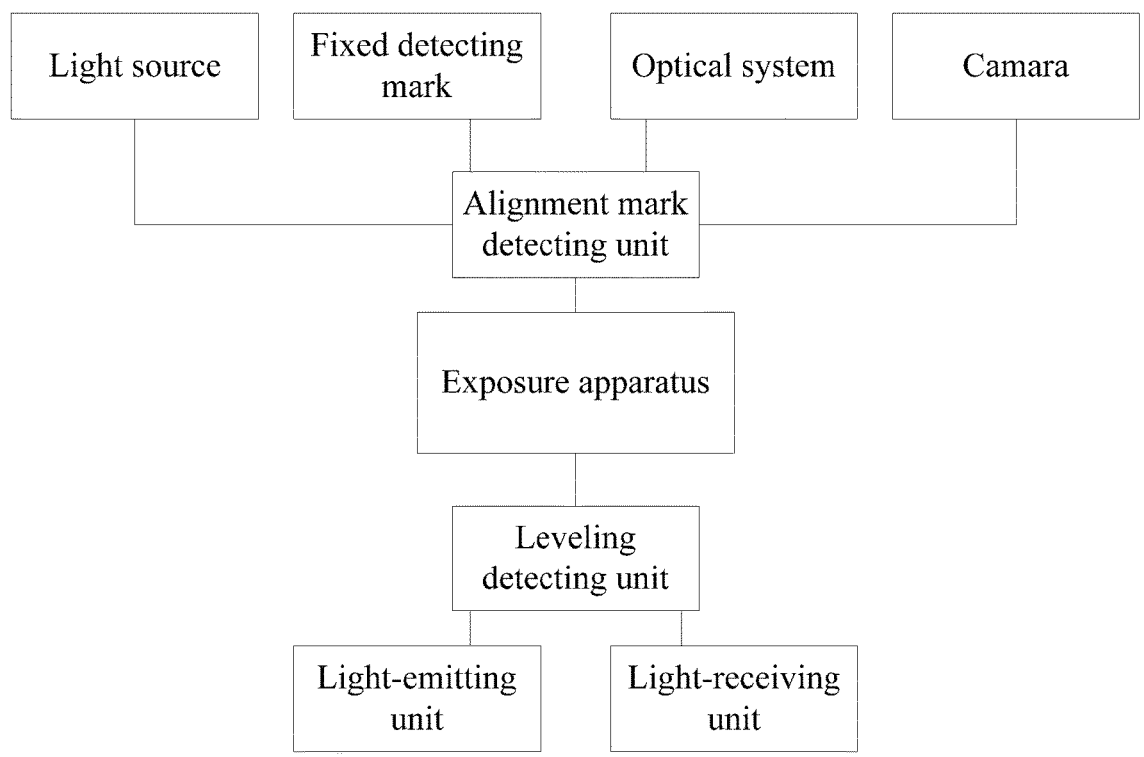
FIG. 9 illustrates an exemplary block diagram of an exposure apparatus consistent with the disclosed embodiments.

The subsequent levelness detection of the semiconductor substrate 200 and the subsequent exposure of the photoresist layer may all be performed in an exposure apparatus. FIG. 9 illustrates a corresponding exposure apparatus. As shown in FIG. 9, the exposure apparatus may comprise a levelness-detecting unit. The levelness-detecting unit may include a light-emitting unit and a light-receiving unit. The light-emitting unit may be used to generate a levelness-detecting light; and cause the levelness-detecting light to irradiate the semiconductor substrate 100. The light-receiving unit may be used to receive the levelness-detecting light reflected by the optical auxiliary layer 203.

Further, the exposure apparatus may also include an alignment-mark-detecting unit. The alignment-mark-detecting unit may be used to detect alignment marks formed on the semiconductor substrate 200 to align a reticle with the semiconductor substrate 200. When the alignment marks are detected, the alignment-mark-detecting unit may emit an alignment-mark-detecting light to the alignment marks on the wafer (the semiconductor substrate 200).

In one embodiment, the alignment-mark-detecting unit may include a light source (e.g., a halogen light), fixed detecting marks, an optical imaging system, and a camera (CCD), etc. During detecting the alignment-marks, the light source may emit the alignment-mark-detecting light to irradiate the alignment marks on the semiconductor substrate 200, the camera (CCD) may receive the light reflected by the alignment marks; and cause the alignment marks and the fixed detecting marks to form images on the viewing screen of the CCD camera. By performing data processing with the image signals on the CCD camera, the coordinate of the alignment marks relative to the fixed detecting marks may be obtained; and the alignment of the substrate 200 may be performed.

In one embodiment, the aliment marks may be formed in the dielectric layer 201 under the optical auxiliary layer 203. In certain other embodiments, the alignment marks may be formed on the surface of the semiconductor substrate 200.

In one embodiment, the alignment mark detection may be performed before the levelness detection of the semiconductor substrate 200. In certain other embodiments, the alignment mark detection may be performed after the levelness detection of the semiconductor substrate 200.

The wavelength of the light used for the alignment mark detection and the wavelength of the light used for the levelness detection of the semiconductor substrate 200 may be different. For example, the wavelength of the light used for the levelness detection of the semiconductor substrate 200 may be in a range of approximately 200 nm~600 nm, such as 200 nm, 300 nm, 400 nm, 500 nm, or 600 nm. The wavelength of the light used for the alignment mark detection may be in a range of approximately 600 nm~1200 nm, such as 600 nm, 700 nm, 800 nm, 900 nm, 1000 nm, 1100 nm, or 1200 nm. In one embodiment, the wavelength of the light used for the levelness detection of the semiconductor substrate 200 is approximately 500 nm; the wavelength of the light used for the alignment mark detection is approximately 800 nm.

In one embodiment, the light used for the levelness detection of the semiconductor substrate 200 may be a single wavelength light with a first wavelength in a range of approximately 200 nm~600 nm. The light-absorbing coefficient of the optical auxiliary layer 203 under the first wavelength may be greater than approximately 0.1.

In certain other embodiments, the light used for the levelness detection of the semiconductor substrate 200 may be the single wavelength light with a wavelength in a range of approximately 200 nm~600 nm. The light-absorbing coefficient of the optical auxiliary layer 203 under such a wavelength may be greater than approximately 0.3.

In certain other embodiments, the wavelength of the light used for the levelness detection of the semiconductor substrate 200 may be in a certain range, i.e., variable wavelength, for example, in a range of approximately 200 nm~600 nm. The light-absorbing coefficient of the optical auxiliary layer 203 under such a variable wavelength light may be greater than approximately 0.1.

In certain other embodiments, the light used for the levelness detection of the semiconductor substrate 200 may be a variable wavelength light. For example, the wavelength of the light may vary in a range of approximately 200 nm~600 nm. The light-absorbing coefficient of the optical auxiliary layer 203 under such a variable wavelength light may be greater than approximately 0.3.

In one embodiment, the light used for the alignment mark detection may be a second single wavelength light with the wavelength in a range of approximately 600 nm~1200 nm. The wavelength of the light for alignment mark detection may also be in a certain range, for example, in a range of approximately 600 nm~1200 nm. The light-absorbing coefficient of the optical auxiliary layer 203 under the second wavelength or a wavelength range may be smaller than approximately 0.1.

During a levelness-detecting process of the semiconductor substrate 200 and an alignment-mark-detecting process of the semiconductor substrate 200, it may need to cause the levelness-detecting light transmitting through the optical auxiliary layer 203 to be absorbed as much as possible. At the same time, the optical auxiliary layer 203 might not affect the alignment-mark-detecting light; and the alignment-mark-detecting light may transmit downwardly through the optical auxiliary layer 203. Accordingly, in certain embodiments, the light-absorbing coefficient of the optical auxiliary layer 203 under the wavelength of the levelness-detecting-light in a certain range of the range of approximately 200 nm~600 nm may be greater than 0.3. The light-absorbing coefficient of the optical auxiliary layer 203 under the alignment-mark-detecting with a variable wavelength in a certain range of the range of approximately 600 nm~1200 nm may be smaller than 0.1.

Accordingly, the optical auxiliary layer 203 may be made of SiON, SiOC, amorphous carbon, or organic spin-on material, etc. In one embodiment, the optical auxiliary layer 203 is made of one of SiON, SiOC, and amorphous carbon. By adjusting the density of the optical auxiliary layer 203, the light-absorbing coefficient of the optical auxiliary layer 203 may be adjusted. Various processes may be used to form the optical auxiliary layer 203, such as a chemical vapor deposition (CVD) process, a physical vapor deposition (PVD) process, or a flowable CVD (FCVD) process, etc.

In certain other embodiments, the optical auxiliary layer 203 is made of organic spin-on material. The organic spin-on material may contain dye that is able to absorb the levelness-detecting light. By adjusting the concentration and type of the dye in the organic spin-on material, the light-absorbing coefficient of the optical auxiliary layer 203 may be adjusted. The dye may include one or more of the derivatives of bensotriazole, bensophenone, cyclic iminoesters, anthracene, and naphthalin, etc. The organic spin-on material may also include resin. The resin may include polyester resins, acrylic resins, cellulosic resins, polyolefin resins, polyvinyl chloride resins, polycarbonate, polyurethane resins, and polypropylene, etc.

The optical auxiliary layer 203 made of the organic spin-on material may be formed by a spin-coating process. The thickness of the optical auxiliary layer 203 may be in a range of approximately 50 nm~200 nm.

Returning to FIG. 8, after forming the optical auxiliary layer 203, a photoresist layer 206 may be formed (S103). FIG. 4 illustrates a corresponding semiconductor structure.

As shown in FIG. 4, a photoresist layer 206 is formed over the optical auxiliary layer 203. In one embodiment, before forming the photoresist layer 206, a silicon oxide layer 204 may be formed on the optical auxiliary layer 203; and a bottom anti-reflective coating (BARC) 205 may be formed on the silicon oxide layer 204. The photoresist layer 206 may be formed on the bottom anti-reflective coating 205.

The silicon oxide layer 204 may be formed as an insolation layer between the bottom anti-reflective coating 205 and the optical auxiliary layer 203. The silicon oxide layer 204 may also be used as a mask layer for subsequently etching the dielectric layer 201 to increase the etching selectivity between the dielectric layer 201 and the mask layer.

Figure 5:
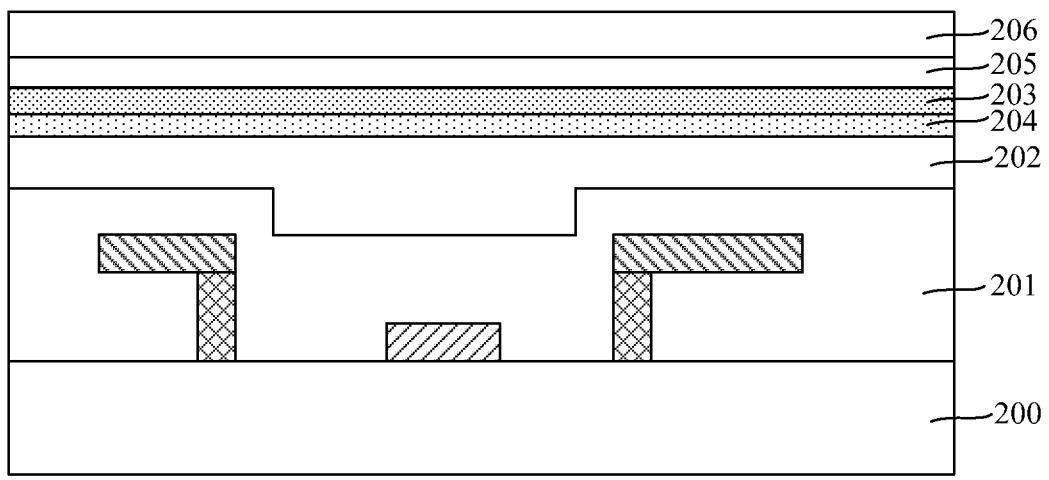
FIG. 5 illustrates another exemplary semiconductor structure consistent with the disclosed embodiments.

In certain other embodiments, as shown in FIG. 5, the silicon oxide layer 204 may be formed on the filling layer 202; and the optical auxiliary layer 203 may be formed on the silicon oxide layer 204. Then, the bottom anti-reflective coating 205 may be formed on the optical auxiliary layer 203; and the photoresist layer 206 may be formed on the bottom anti-reflective coating 205. The silicon oxide layer 204 may be configured as an insolation layer between the filling layer 202 and the optical auxiliary layer 203.

Figure 6:
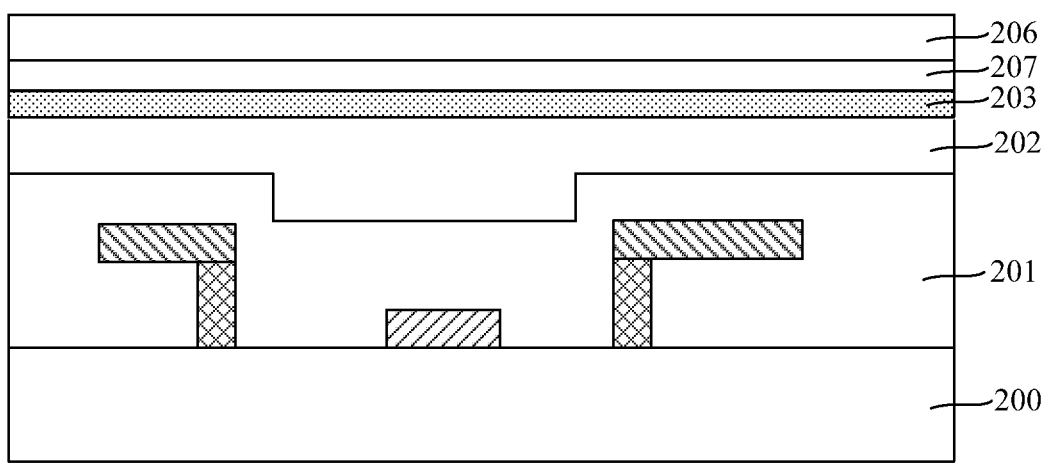
FIG. 6 illustrates another exemplary semiconductor structure consistent with the disclosed embodiments.

In certain other embodiments, as shown in FIG. 6, a silicon-containing bottom anti-reflective coating 207 may be formed on the optical auxiliary layer 203; and the photoresist layer 206 may be formed on the silicon-containing bottom anti-reflective coating 207. The silicon-containing bottom anti-reflective coating 207 may be used as both an anti-reflective layer and an insulation layer between the optical auxiliary layer 203 and the photoresist layer 206.

The silicon oxide layer 204 may be formed by any appropriate process, such as a CVD process, a PVD process, or an FCVD process, etc. The bottom anti-reflective coating 205 may be formed by any appropriate process, such as a spin-coating process, etc. The silicon-containing bottom anti-reflective coating 207 may be formed by any appropriating process, such as a spin-coating process, etc. The photoresist layer 206 may be formed by any appropriate process, such as a spin-coating process, etc.

Figure 7:
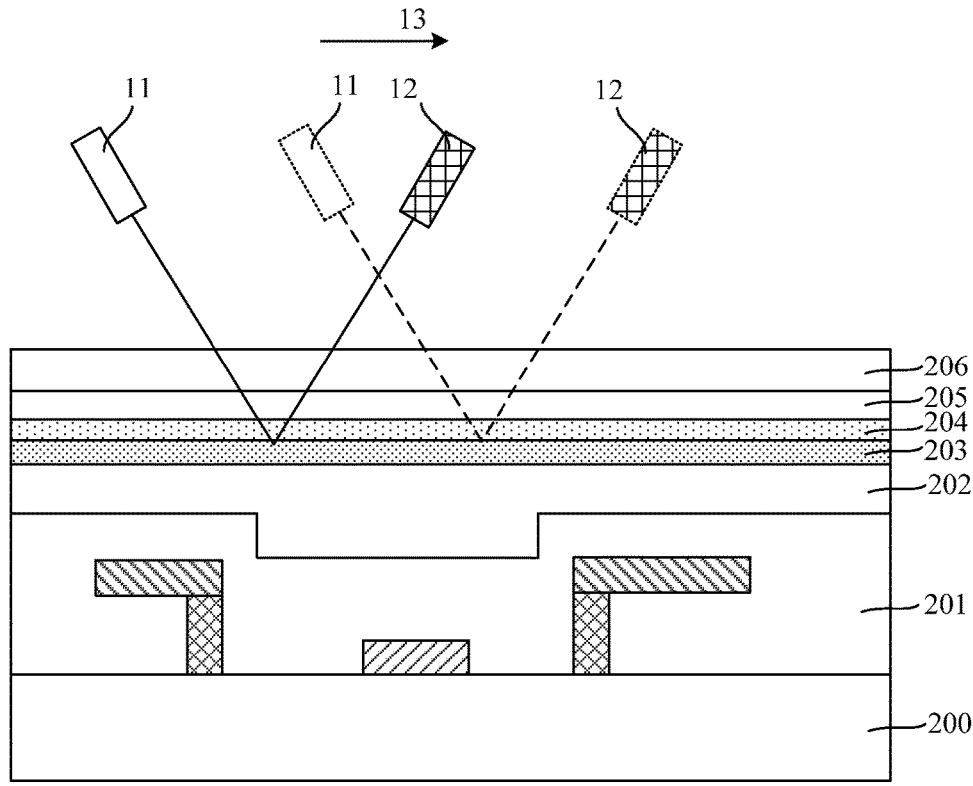
FIG. 7 illustrates an exemplary levelness detection process of a semiconductor substrate consistent with the disclosed embodiments.

Returning to FIG. 8, after forming the photoresist layer 206, the levelness of the semiconductor substrate 200 may be detected; and the photoresist layer 206 may be exposed (S104). FIG. 7 illustrates a corresponding structure.

Before exposing the photoresist layer to form patterns, it may need to detect the levelness of the semiconductor substrate 200. The levelness of the semiconductor substrate 200 may be used to accurately compensate the focusing plane of the exposure apparatus during the exposure process such that the patterns formed in the photoresist layer 206 may have a relatively high fidelity.

As shown in FIG. 7, the exposure apparatus for exposing the photoresist layer 206 may comprise a levelness-detecting unit (not labeled). The levelness-detecting unit may include a light-emitting unit 11 and a light-receiving unit 12. The light-emitting unit 11 may be used to generate a levelness-detecting light; and to cause the levelness-detecting light to irradiate the semiconductor substrate 200. The light-receiving unit 12 may be used to receive the levelness-detecting light reflected by the optical auxiliary layer 203.

During a levelness-detecting process of the semiconductor substrate 200, the light-emitting unit 11 may emit a levelness-detecting light; and the levelness-detecting light may irradiate the semiconductor substrate 200. Referring to FIG. 7, a portion of the levelness-detecting light may be reflected by the surface of optical auxiliary layer 203; and received by the light-receiving unit 12. The light-receiving unit 12 may convert the received light to electrical signals; and process the electrical signals to determine the levelness of the semiconductor substrate 200. Thus, the levelness of the semiconductor substrate 200 may be obtained. During the levelness-detecting process, the levelness-detecting unit may scan along the scanning direction 13.

During levelness-detecting process, when the levelness-detecting light irradiates the semiconductor substrate 200, a portion of the levelness-detecting light may be reflected by the optical auxiliary layer 203; and a portion of the levelness-detecting light may be absorbed by the optical auxiliary layer 203 when the portion of the levelness-detecting light transmits downwardly through the optical auxiliary layer 203. Thus, the levelness-detecting light may not transmit through the optical auxiliary layer 203 and reach the semiconductor substrate 200 and the metal interconnect lines, etc. Therefore, noises caused by a portion of the levelness-detecting light reflected by the metal interconnect lines, etc., may be reduced; and the accuracy of the levelness detection of the substrate 200 may be improved. Even a portion of the levelness-detecting light may transmit through the optical auxiliary layer 203; and may be reflected by the semiconductor substrate 200 and the metal interconnect lines, the reflected levelness-detecting light may be absorbed by the optical auxiliary layer 203 when the reflected levelness-detecting transmit upwardly through the optical auxiliary layer 203.

Further, the optical auxiliary layer 203 may be formed on the filling layer 202. The surface of the filling layer 202 may have a relatively high flatness. During the levelness-detecting process, the distribution of the levelness-detecting light reflected by the optical auxiliary layer 203 may be uniform. By detecting the uniformly reflected levelness-detecting light, a relatively accurate levelness detection may be achieved.

The alignment-mark-detecting step may be performed before, or after the levelness-detecting process. In one embodiment, the wavelength of the light used for the alignment-mark-detecting step and the wavelength of the light used for the levelness-detecting step may be different. The light used for the levelness detection may be a single wavelength light with a wavelength in a range of approximately 200 nm~600 nm, or a light with wavelength in a certain range of a range of approximately of 200 nm~600 nm. Under such a wavelength or a wavelength range, the light-absorbing coefficient of the optical auxiliary layer 203 may be greater than approximately 0.1. The light used for the alignment mark detection may be a single wavelength light with a wavelength in a range of approximately 600 nm~1200 nm, or a light with wavelength in a certain range of a range of approximately of 600 nm~1200 nm. Under such a wavelength or a wavelength range, the light-absorbing coefficient of the optical auxiliary layer 203 may be smaller than approximately 0.1.

When the levelness-detecting process is performed, the optical auxiliary layer 203 may absorb the levelness-detecting light transmitting downwardly through the optical auxiliary layer 203. Thus, the levelness-detecting light may not reach the surfaces of the semiconductor substrate 200 and the metal interconnect lines; and may not be reflected by the surfaces of the semiconductor substrate 200 and the metal interconnect lines. Therefore, the noises caused by the levelness-detecting light reflected by the surface of the semiconductor substrate 200 and the surfaces of the metal interconnect line may be reduced; the accuracy of the levelness detection may be improved. At the same, when the alignment-mark-detecting process is performed. The optical auxiliary layer 203 may not absorb the alignment-mark-detecting light transmitting through the optical auxiliary layer 203. Thus, the optical auxiliary layer 203 may not affect the wafer alignment process.

After the levelness-detecting process and the alignment-mark-detecting process, an exposure process may be performed. Then, a developing process may be performed onto the exposed photoresist layer 206. Thus, patterns may be formed in the photoresist layer 206.

Further, the patterned photoresist layer 206 may be used as an etching mask to etch the bottom anti-reflective coating 205, the silicon oxide layer 204, the optical auxiliary layer 203, the filling layer 202, and the dielectric layer 201. Thus, the patterns in the patterned photoresist layer may be transferred to the dielectric layer 201.

The bottom anti-reflective coating 205, the silicon oxide layer 204, the optical auxiliary layer 203, the filling layer 202, and the dielectric layer 201 may be etched by any appropriate process, such as a dry etching process, a wet etching process, or an ion beam etching process, etc. The dielectric layer 201 may be etched through to form through-holes; or may be etched partially to form trenches.

In one embodiment, the through-holes may expose the metal interconnect structures in the dielectric layer 201. After forming the through-holes, a metal material may be filled in the through-holes to form conducive vias electrically connected with the metal interconnect structures.

The trenches may expose the metal interconnect structures, or may not expose the metal interconnect structure. After forming the trenches, a semiconductor material may be formed in the trenches to form semiconductor devices, such as transistor, etc. Alternatively, a metal material may be formed in the trench to form metal lines, etc. The metal lines may be used as portions of metal interconnect structure.

Thus, a semiconductor structure may be formed by the above disclosed processes and methods; and the corresponding semiconductor is illustrated in FIG. 4. As shown in FIG. 4, the semiconductor structure includes a semiconductor substrate 200; and a plurality of semiconductor devices (not labeled) formed on the semiconductor substrate 200. The semiconductor structure may also include a dielectric layer 201 covering the semiconductor devices formed on the semiconductor substrate 200; and a filling layer 202 formed on the dielectric layer 201. Further, the semiconductor structure may include an optical auxiliary layer 203 formed on the filling layer 202. The optical auxiliary layer 203 may be used to reflect a portion of a levelness-detecting light and absorb a portion of the levelness-detecting light transmitting through the optical layer 203 during a levelness-detecting process. Further, the semiconductor structure may also include a silicon oxide layer 204 formed on the optical auxiliary layer 203; and a bottom anti-reflective coating 205 formed on the silicon oxide layer 204. Further, the semiconductor structure may also include a patterned photoresist layer 206 formed on the bottom anti-reflective layer 205. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
providing a semiconductor substrate;
forming a plurality of semiconductor devices on the semiconductor substrate;
forming a dielectric layer covering the plurality of semiconductor devices on the semiconductor substrate;
forming an optical auxiliary layer configured to reflect a portion of a levelness-detecting light entering the optical auxiliary and to absorb a portion of the levelness-detecting light transmitting through the optical auxiliary layer over the dielectric layer;
forming a photoresist layer over the optical auxiliary layer; and
detecting a levelness of the semiconductor substrate and exposing the photoresist layer by a same exposure apparatus, to form a patterned photoresist layer, wherein:
the exposure apparatus comprises a levelness-detecting unit including: a light-emitting unit configured to emit the levelness-detecting light and to cause the levelness-detecting light to irradiate the optical auxiliary layer, and a light-receiving unit configured to receive the levelness-detecting light reflected by the optical auxiliary layer.

2. The method according to claim 1, wherein:
the levelness detecting-light is a single wavelength light with a first wavelength in a range of approximately 200 nm~600 nm; and
a light-absorbing coefficient of the optical auxiliary layer under the first wavelength is greater than approximately 0.3.

3. The method according to claim 1, wherein:
the levelness-detecting light is a variable wavelength light with a wavelength range in a range of approximately 200 nm~600 nm; and
a light-absorbing coefficient of the optical auxiliary layer under the wavelength range is greater than approximately 0.3.

4. The method according to claim 1, wherein:
the exposure apparatus comprises an alignment-mark-detecting unit configured to detect alignment marks; and
the alignment-mark-detecting unit emits an alignment-mark-detecting light to irradiate the alignment marks during an alignment-mark-detecting process.

5. The method according to claim 4, wherein:
a wavelength of the alignment-mark-detecting light is different from the wavelength of the levelness-detecting light.

6. The method according to claim 5, wherein:
the alignment-mark-detecting light is a single wavelength light with a second wavelength in a range of approximately 600 nm~1200 nm; and
a light-absorbing coefficient of the optical auxiliary layer under the second wavelength is smaller than approximately 0.1.

7. The method according to claim 5, wherein:
the alignment-mark-detecting light is a variable wavelength light with a wavelength range approximately 600 nm~1200 nm; and
a light-absorbing coefficient of the optical auxiliary layer under the wavelength range is smaller than approximately 0.1.

8. The method according to claim 1, before forming the optical auxiliary layer, further comprising:
    forming a filling layer on the dielectric layer.

9. The method according to claim 8, further comprising:
    forming a silicon oxide layer on the filling layer;
    forming the optical auxiliary layer on the filling layer;
    forming a bottom anti-reflective coating on the optical auxiliary layer; and
    forming the photoresist layer on the bottom anti-reflective coating.

10. The method according to claim 8, further comprising:
    forming the optical auxiliary layer on the filling layer;
    forming a silicon oxide layer on the optical auxiliary layer;
    forming a bottom anti-reflective coating on the silicon oxide layer; and
    forming the photoresist layer on the bottom anti-reflective coating.

11. The method according to claim 8, further including:
    forming the optical auxiliary layer on the filling layer;
    forming a bottom anti-reflective coating on the optical auxiliary layer; and
    forming the photoresist layer on the bottom anti-reflective coating.

12. The method according to claim 1, wherein:
    the optical auxiliary layer is made of one of SiON, SiOC, amorphous carbon and organic spin-on material.

13. The method according to claim 12, wherein:
    the organic spin-on material comprises a dye absorbing the levelness-detecting light.

14. The method according to claim 13, wherein:
    the dye includes one or more of derivatives of bensotriazole, bensophenone, cyclic iminoesters, anthracene, and naphthalin.

15. The method according to claim 12, wherein:
    the organic spin-on material is a resin including one of polyester resin, acryl type resin, cellulose resin, polyolefin resin, polyvinyl chloride resin, polycarbonate, and urethane type resin.

16. The method according to claim 1, wherein:
    the optical auxiliary layer is formed by a chemical vapor deposition process.

17. The method according to claim 1, further comprising forming a plurality of conductive vias in the dielectric layer by:
    etching the optical auxiliary layer and the dielectric layer using the patterned photoresist layer as an etching mask to form a plurality of through-holes; and
    filling the contact through-holes with a metal material.

* * * * *